(12) United States Patent
Hoagland

(10) Patent No.: US 6,180,935 B1
(45) Date of Patent: Jan. 30, 2001

(54) DYNAMIC RANGE EXTENSION OF CCD IMAGERS

(75) Inventor: Kenneth A. Hoagland, Smithtown, NY (US)

(73) Assignee: Lockheed Martin Corporation, Syosset, NY (US)

( * ) Notice: Under 35 U.S.C. 154(b), the term of this patent shall be extended for 0 days.

(21) Appl. No.: 09/236,543

(22) Filed: Jan. 25, 1999

(51) Int. Cl.$^7$ ...................................................... H01L 27/00
(52) U.S. Cl. ................................... 250/208.1; 250/214 R; 348/297
(58) Field of Search ............................ 250/208.1, 214 R, 250/214 LA, 214 LS; 348/308, 311, 303, 302, 294, 297; 257/291, 296, 300

(56) References Cited

U.S. PATENT DOCUMENTS

| | | | |
|---|---|---|---|
| Re. 34,802 | 11/1994 | Sayag | 250/208.1 |
| 6,040,570 | * 3/2000 | Levine et al. | 250/208.1 |

OTHER PUBLICATIONS

"Solid State Imaging with Charge Coupled Devices", by A. Theuwissen, pp. 176–189, published by Kluwer Academic Publishers, 1995. (Month Unknown).

* cited by examiner

Primary Examiner—Que T. Le
(74) Attorney, Agent, or Firm—Perman & Green, LLP

(57) ABSTRACT

Dynamic range extension (DRE) is achieved in CCD imagers with charge overflow structures by varying the potential $V_G$ on the gate electrodes of the pixel signal charge wells during charge integration. The wells are formed to function with the charge overflow structures, e.g., vertical overflow drains, VODs, a) to control the signal charge spreading due to illumination overload and/or b) as a means for the control of signal integration time. Two different $V_G$ levels are applied to the gate electrodes, the lower of the two levels $V_G$-LOW is applied for a long duration and the higher level $V_G$-HIGH is applied for a shorter duration during charge integration. At low levels of incident illumination on the CCD surface, charge signals are integrated without saturation, but, at levels of very intense illumination during the period with voltage $V_G$-LOW on the gates, the pixel wells will saturate before the end of charge integration, resulting in the vertical overflow drain (VOD) operating to dump excess charge to the substrate. With the subsequent imposition of $V_G$-HIGH for a short time period near the end of the integration interval, pixel well saturation is delayed and signals corresponding to high intensity are not lost. Consequently, imposing $V_G$-HIGH for a short time period near the end of the integration interval (a) increases pixel charge storage capacity and (b) shortens the exposure time, which combination allows high intensity signal information to be integrated without loss by saturation.

17 Claims, 5 Drawing Sheets

DYNAMIC RANGE EXTENSION OF CCD IMAGERS

BACKGROUND OF THE INVENTION

1. Field of the Invention

The present invention relates to charge coupled device (CCD) imagers, and more particularly, to a method and means for extending the dynamic range of such imagers, to enable signal detection at illumination input conditions significantly greater than those at which CCD signal saturation is reached with conventional operating conditions, whereby signal information above the saturation level that would otherwise be lost is made available.

2. Prior Art

The need for extending the dynamic range of CCD imagers while avoiding the loss of low light signal response has resulted in the development of various methods that create a non-linear response in such devices, such as typified by that described in U.S. Pat. No. RE. 34,802 issued Nov. 29, 1994 to Michel Sayag. Essentially, the dynamic range of the pixels on a CCD sensing surface, which surface contains a plurality of pixels consisting of gate controlled charge integration wells, is limited by the charge handling capacity of the signal charge integration well sites. In the case when high intensity illumination is incident upon the CCD surface, the wells can saturate before the end of charge integration thus causing a large loss in signal response for high intensity scene information. Thus, such CCD sensing surfaces may not function satisfactorily when sensing scenes with very large in-scene variations in illumination level.

3. Problem to be Solved

Accordingly, a problem is presented by charge saturation and loss in signal response in such CCD environments, that limits the dynamic range of these imaging devices.

4. Objects

It is therefore an object of the present invention to provide a method and means for overcoming the integration well site charge saturation problem in CCD imagers.

It is another object of the invention to provide a structure and and an operating method that extends the dynamic range of CCD imagers to overcome the charge saturation problem in such imagers.

SUMMARY OF THE INVENTION

The present invention is directed to achieving dynamic range extension (DRE) in CCD imagers by varying the potential $V_G$ of the gate electrodes, i.e., "gates", that are used to form pixel signal charge wells during charge integration. To this end, the CCD surface comprising the image format area is provided with a charge overflow structure, in the form of an overflow drain, i.e., a vertical overflow drain (VOD) or lateral overflow drain (LOD), that functions a) to control the signal charge spreading due to illumination overload and/or b) as a means for the control of signal integration time, commonly known as electronic shuttering. The overflow drain structure, preferably a VOD, is embodied in the image area of a typical charge coupled device (CCD), such as a frame transfer CCD, and is formed within an n-Si substrate by depositing a p− well portion therein, which in turn has two p+ regions deposited on opposite sides of an n− region deposited at the upper surface of the well. A gate electrode is formed on a dielectric layer above the p+ and n− regions on the upper surface and has a potential $V_G$ imposed thereon. In accordance with the invention, two different $V_G$ levels are applied to the gates, one long in time duration followed by one short in time duration, in a manner that provides significant extensions in dynamic range. Specifically, the lower of the two levels $V_G$-LOW is applied for the long duration and the higher level $V_G$-HIGH is applied for the shorter duration to the gates over the integration well sites. During the imposition of $V_G$-LOW, the well sites are smaller in charge handling capacity than for the $V_G$-HIGH condition. For a typical case, the level of voltage $V_G$-LOW is set to achieve a maximum pixel well capacity equal to 25% to 50% of the full 100% well capacity achievable with voltage $V_G$-HIGH. Also the time duration for $V_G$-LOW is ideally a large fraction of the total integration time, typically greater than 90%.

With this structural arrangement and voltage pattern, upon the incidence of very intense illumination on the CCD surface during the period with voltage $V_G$-LOW on the gates, pixel signal charge will typically exceed the CCD well capacity and the pixel wells will saturate before the end of charge integration, resulting in the vertical overflow drain (VOD) operating to dump excess charge to the substrate. Thus, image signal modulation at or near the high intensity region can be severely attenuated or lost completely. However, with the subsequent imposition of $V_G$-HIGH for a short time period near the end of the integration interval, in keeping with the invention, signals corresponding to high intensity are not lost, since they are integrated during the short time when $V_G$ is set high. At the same time, all low level signals, i.e., below the 30% $V_G$-LOW level, are integrated without saturation during the $V_G$ low state which is held for nearly the full integration time period. Accordingly, shifting $V_G$ to $V_G$-HIGH for a short time period near the end of the integration interval (a) increases pixel charge storage capacity and (b) shortens the exposure time, which combination allows high intensity signal information to be integrated without loss by saturation.

Preferably $V_G$-LOW is set above the reference signal level used in CCD imager or camera systems for automatic light control (typically ¼ to ½ full well saturation), since, if $V_G$-LOW is set too low, low level signals will saturate, causing a loss in low light scene information. If set too high, high intensity signals will saturate, causing a loss in high intensity light scene information. Also, when the invention is used in CCD camera systems with exposure control gating, the DRE waveforms should adapt to changes in the varying duration of integration time.

DETAILED DESCRIPTION OF THE PREFERRED EMBODIMENT

The present invention involves a method and means for achieving dynamic range extension (DRE) in CCD imagers, by constructing the sensing surfaces with pixels incorporating an improved charge overflow structure defining gate controlled charge integration well sites, and by varying the potential levels $V_G$ on the gates of the pixel signal charge integration well sites during the integration of high intensity incident illumination on the CCD surface. The invention is directed to extending the dynamic range of CCD imagers to enable signal detection at illumination input conditions significantly greater than those at which CCD signal saturation is reached with conventional operating conditions, so that signal information above the saturation level that would otherwise be lost is made available to observers viewing scenes with very large in-scene variations in illumination levels.

The improved charge overflow structure involves an overflow drain structure, preferably a vertical overflow drain (VOD). Use of a VOD is one of several methods devised by CCD designers to prevent signal overloads from spreading to adjacent non-overloaded pixel sites, typically to prevent charge spreading along the column direction. Accordingly, VOD configurations are known as a means for "antiblooming", where "vertical" implies diverting excess charges to a substrate drain beneath the photosite. In addition to the anti-blooming function, VOD is also utilized as a means for exposure control or electronic shuttering. For a fuller understanding of VOD designs and functions, reference may be had to the text, "Solid State Imaging with Charge Coupled Devices", by A. Theuwissen, pps. 176–189, published by Kluwer Academic Publishers, 1995. While the most significant prior art method uses a lateral overflow drain (LOD), as described on Page 177 of the text and the above-noted patent to M. Sayag, and the invention can be implemented with either a VOD or LOD, since the LOD structure limits the useful area available for photodetection, a VOD is preferred.

Figure 1:
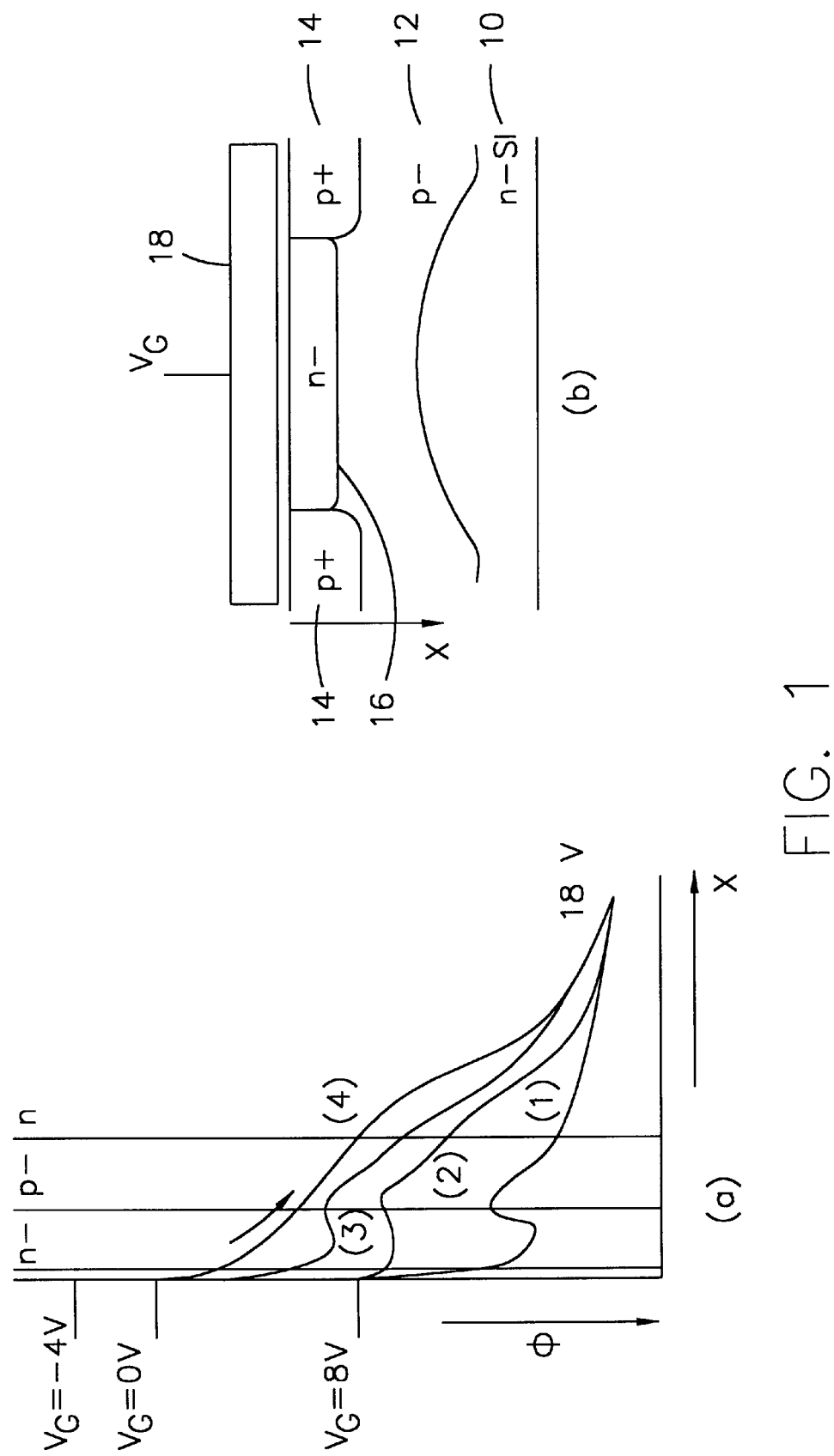
FIG. 1 illustrates the potential profiles for vertical overflow drain (VOD) operation in the image format region of a CCD frame transfer pixel in accordance with the invention, with section (a) showing the potential diagrams through the center of such a frame transfer pixel, and section (b) showing the cross section of such pixel structures.

A charge overflow structure or vertical overflow drain (VOD) for use with the invention is formed in the frame transfer pixels of a typical charge coupled device (CCD) image sensing surface and functions to control the signal charge spreading due to illumination overload, and/or as a means for the control of signal integration time, commonly known as electronic shuttering. The VOD structure is shown in cross-section along the column direction in FIG. 1(b). Each pixel is formed within an n-Si substrate 10 by depositing a p– well portion 12 therein, which in turn has two p+ regions 14 deposited on opposite sides of an n– region 16 deposited at the upper surface of the well. The p+ regions 14 act as channel stops for containing charge transport or flow within the channel regions between them. A gate electrode 18 is formed on a dielectric layer above the p+ and n– regions on the upper surface and has a potential $V_G$ imposed thereon. FIG. 1(a) illustrates the potential profiles for vertical overflow drain (VOD) operation in such a frame transfer pixel in the x-direction through the central region thereof. Curve 1 illustrates the potential profile through the regions in the case of an empty well, which is the condition at the start of signal integration. As charge carriers are created by photons incident on the surface, the electron well pocket, shown at the downward dip in the n– region, begins to fill with electrons, and eventually fills to the near full condition as seen in Curve 2, which is the profile for the well near saturation. Any carriers in excess of full well will spill over the rim of the pocket to be collected at the n-Si substrate 10, thus providing control of signal charge spreading resulting from signal charge overloads.

In a preferred implementation of a CCD imager incorporating the VOD structures, four gate electrodes are located side by side at the surface of each pixel site and arranged at right angles to the column direction of charge transport. During charge integration, one or two of these gate electrodes are biased low, i.e., more negative than the +8 V level for Curve 2. With sufficiently low bias, i.e., as low as the 0 V level of Curve 3, excess charges can only spill to the substrate. Curve 3 shows the profile with the gate electrode 18 biased to 0 V, illustrating the gate bias condition necessary to prevent excess charge from spilling along the column direction. Complete spilling of all pixel charges is achieved when $V_G$ bias is shifted to the even more negative value, $V_G$ equals –4V illustrated by Curve 4. Curve 4 shows the gate potential for emptying the well. This condition, which spills all charges to substrate, is used for electronic shuttering.

Figure 2:
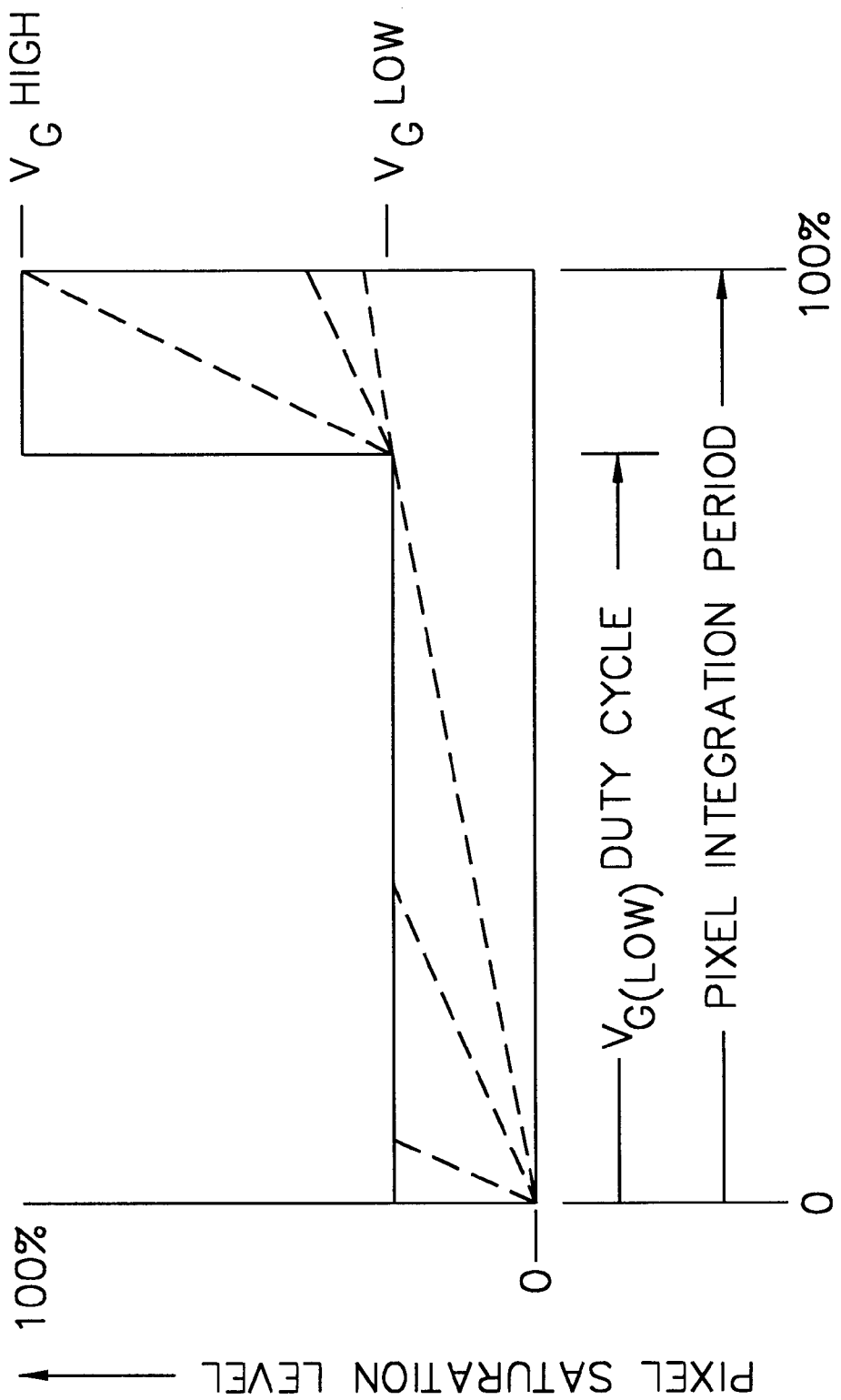
FIG. 2 is a diagram of pixel saturation level vs. charge integration time to illustrate the programmed VOD operation for DRE charge skimming in accordance with the invention and shows how the use of two $V_G$ levels, one long in time duration and one short in time duration, can provide significant extensions in dynamic range.
Figure 5:
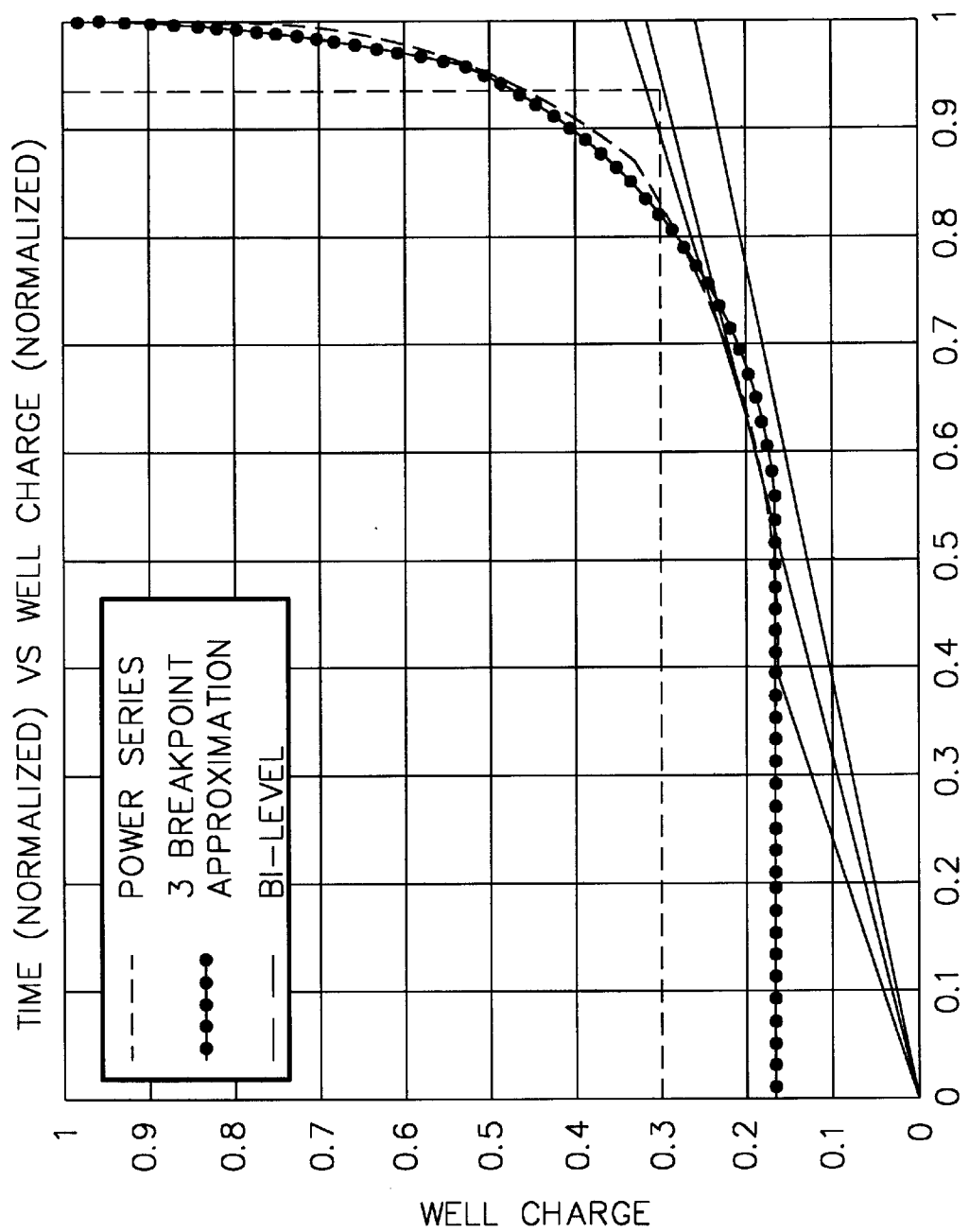
FIG. 5 shows a comparison of waveform shapes of well charge versus time illustrating how a shaped waveform would be used in place of a simple bi-level waveform to achieve DRE control with the invention during the integration interval.

The dynamic range of the pixels shown in FIG. 1(b) is limited by the charge handling capacity of the integration well site. As noted, in the case of high intensity incident illumination on a CCD surface made up of a plurality of these pixels with a relatively low $V_G$ potential level on the integrating site gates, the wells will saturate before the end of integration and thus the pixel well sites will saturate and the resulting vertical overflow drain (VOD) operates to dump excess charge to the substrate. However, dynamic range extension (DRE) can be achieved in acccordance with the invention through the use of different, e.g., two, potential $V_G$ levels on the gates of the pixel signal charge integration well sites to allow integration of high intensity incident illumination on the CCD surface. More specifically, FIG. 2 illustrates how, for example, two $V_G$ voltage levels, one long in time duration and one short in time duration, can be used in a manner that will provide significant extensions in dynamic range. The low voltage level $V_G$-LOW is imposed on the pixel gates for a comparatively long time duration as compared to the shorter duration during which $V_G$-HIGH is imposed. The dashed line curves correspond in slope to the intensity of the incident illumination falling on the CCD surface. The low slope illustrates the rate of pixel charge buildup for low illumination and the high slope illustrates the rate of pixel charge buildup for high illumination. The levels $V_G$-LOW and $V_G$-HIGH denote voltage levels applied to the pixel gates over the integration well sites. This voltage application may be accomplished by connecting the CCD gate electrodes to drive circuits that supply voltage waveforms to form pixel charge packets and shift the packets from the point of origin to the output signal detector. Typically, the VG voltages for the image format region have been held constant during charge integration. However, to achieve DRE with the invention, a time varying waveform consisting of two or more levels, or a shaped analog varying waveform, as illustrated in FIG. 5, may be used for DRE control during the integration interval. The shaped waveform, including various multilevel waveforms, provides a means for altering the shape of the illumination/signal out transfer characteristic for the region where DRE operates to extend dynamic range. With voltage $V_G$-LOW imposed on the gates, the well sites are smaller in charge handling capacity than for the $V_G$-HIGH condition. For a typical case, voltage $V_G$-LOW is set to achieve a maximum pixel well capacity equal to, e.g., 30%, or from 25% to 50%, of the full 100% well capacity achieved with voltage $V_G$-HIGH. Also, to maximize DRE while retaining low signal information, the time duration for $V_G$-LOW is ideally a large fraction of the total integration time, e.g., 15 milliseconds for a TV system with a 60 Hz repetition rate for field integration intervals, or typically greater than 90%.

Upon the impingement of very intense or high intensity illumination on the CCD sensing surface, indicated by the high slope dashed line at the left side of FIG. 2, the $V_G$-LOW level results in pixel well saturation before the end of the integration period causing the vertical overflow drain (VOD) to operate to dump excess charge to the substrate. However, with the imposition of $V_G$-HIGH on the gates for the short time duration in accordance with the invention, signals corresponding to high slope conditions are not lost, since they are integrated during the short time when $V_G$ is set high, which increases capacity and inhibits saturation that would otherwise occur with long time integration. Further, all low level signals, i.e., below the 30% $V_G$-LOW level are integrated without saturation during the $V_G$ low state which is held for nearly the full integration time period.

Preferably $V_G$-LOW is set above the reference signal level for automatic light control (typically ¼ to ½ full well saturation) used in the CCD camera systems in which the invention is implemented, since, if $V_G$-LOW is set too low, the pixels with low level signals will saturate, causing a loss in low light scene information. Also, when the invention is used in camera systems with exposure control gating, the DRE waveforms should adapt to changes in the varying duration of integration time.

Figure 3:
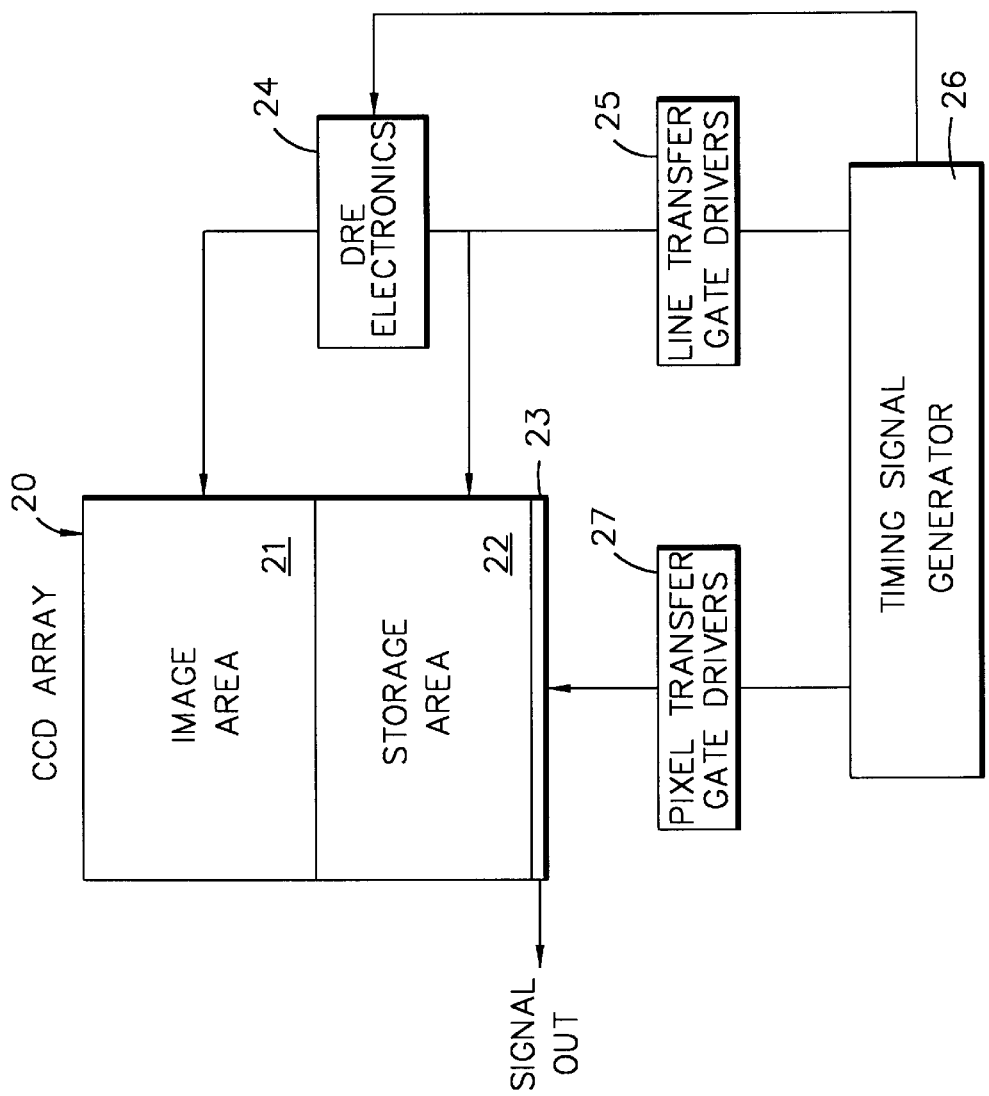
FIG. 3 is a schematic diagram illustrating a circuit implementation for a DRE device in accordance with the invention in a frame transfer CCD imager such as used for television cameras.

FIG. 3 is a schematic diagram illustrating an example of a DRE circuit implementation in accordance with the invention for a frame transfer CCD imager such as used for television cameras. The CCD array 20 typically has an image area 21 for receiving a light image of the scene being imaged and a storage area 22 for storing the charges produced by the received light, which charges are periodically transferred thereto from the image area. The stored charges are then periodically shifted to an output register 23 and output as a representative image signal. Both areas 21 and 22 have an input from DRE electronics unit 24, which has an input directly, and through a line transfer gate drivers unit 25, from the system timing signal generator 26. The system timing signal generator 26 also controls the periodic timing of the image signal output by register 23 through a pixel transfer gate drivers unit 27. The invention may also be implemented in digital photography applications wherein the circuit diagram would be somewhat simpler since a separate storage area is not required.

Figure 4:
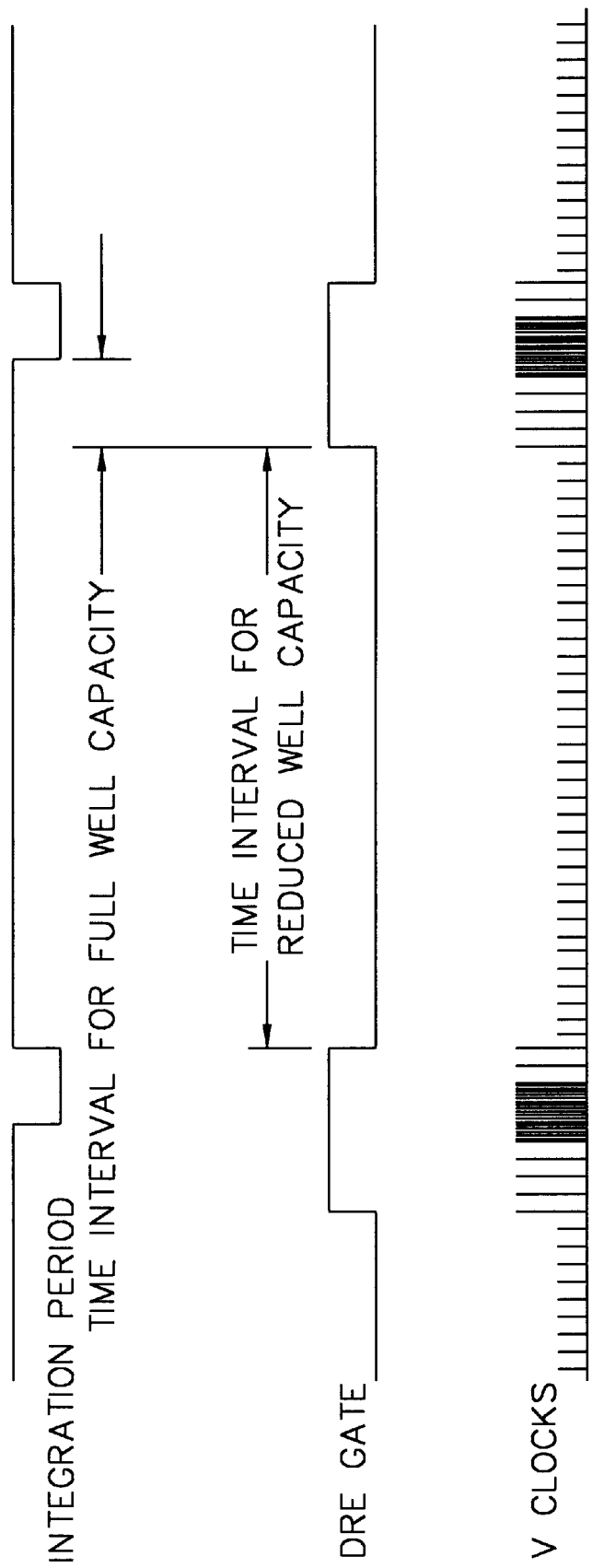
FIG. 4 shows comparative timing diagrams for the integration period, DRE gate voltage, and V clocks output in acccordance with the invention.

FIG. 4 shows comparative timing diagrams for the charge integration period, DRE gate voltage, and V clocks output under the control of the timing signal generator 26 shown in FIG. 3. It will be seen that when the V clock voltage rises from $V_G$-LOW to $V_G$-HIGH, e.g., from +6 to +10, the DRE gate voltage follows. The higher voltage remains on the gates past the end of the existing charge integration period but then drops back to the lower level, 6+, upon the beginning of the next integration period. The time interval for reduced well capacity is between the voltage drop back to 6+ and the next rise to 10+. The time interval for full well capacity is from the end of the reduced well capacity time interval, i.e., the rise to 10+, until the next end of the integration period which coincides with the start of high speed V clocking required to shift pixel charges from the image area to the storage area. As noted above, the reduced well capacity time interval is preferably greater than 90% of the charge integration period leaving less than 10% for the full well capacity time interval.

It will accordingly be seen that an improved charge overflow structure or overflow drain, e.g., vertical (VOD) or lateral (LOD), formed in the frame transfer pixels of a typical charge coupled device (CCD) sensing surface has been presented, along with a technique for extending the dynamic range of such pixels by varying the $V_G$ potential on the gates at the pixel signal charge integration well sites to allow integration of high intensity incident illumination on the CCD surface.

What is claimed is:

1. A method of achieving dynamic range extension (DRE) in a CCD imager exposed to combined low and high intensity illumination, said imager having a CCD imaging surface for converting incident illumination into electrical charge, and gate electrodes acting on said surface having a voltage $V_G$ applied thereto to form pixel signal charge wells at well sites below said surface during charge integration, comprising the steps of:

imposing a voltage $V_G$-LOW on said gate electrodes at the pixel signal charge integration well sites, said voltage $V_G$-LOW being of a level that results in signal charge wells above the reference signal level for automatic light control used in CCD imager systems and of a time duration equal to a large percentage of the total time of charge integration; and then imposing a voltage $V_G$-HIGH on said gate electrodes at the pixel signal charge integration well sites, said voltage $V_G$-HIGH being of a level that is above the level of voltage $V_G$-LOW and of a comparatively short time duration with respect to the total time of charge integration.

2. A method as in claim 1 wherein voltage $V_G$-LOW is set at a level to achieve a maximum pixel well capacity equal to from 25% to 50% of the full 100% well capacity achieved with voltage $V_G$-HIGH.

3. A method as in claim 1 wherein the reference signal level for automatic light control used in CCD imager systems, which the voltage $V_G$-LOW is set above, is ¼ to ½ full well saturation.

4. A method as in claim 1 wherein voltage $V_G$-LOW is imposed for a time duration greater than about 90% of the total time of charge integration.

5. A method as in claim 1 wherein said pixel signal charge integration well sites contain overflow drains (OD).

6. A method as in claim 5 wherein said overflow drains (OD) comprise vertical overflow drains (VOD).

7. A system for achieving dynamic range extension (DRE) in a CCD imager having a CCD imaging surface for converting incident illumination into electrical charge, and gate electrodes acting on said surface having a voltage $V_G$ applied thereto to form pixel signal charge wells at well sites below said surface during charge integration, comprising:

means for imposing a voltage $V_G$-LOW on said gate electrodes at the pixel signal charge integration well sites during the incidence of high intensity illumination on said CCD imaging surface, said voltage $V_G$-LOW being of a level that results in signal charge wells above the reference signal level for automatic light control used in CCD imager systems and of a time duration equal to a large percentage of the total time of charge integration; and means for imposing a voltage $V_G$-HIGH on said gate electrodes at the pixel signal charge integration well sites during the incidence of high intensity illumination on said CCD imaging surface, said voltage $V_G$-HIGH being of a level that is above the level of said voltage $V_G$-LOW and being imposed for a comparatively short time duration with respect to the total time of charge integration following the imposition of said voltage $V_G$-LOW.

8. A system as in claim 7 further comprising means for setting voltage $V_G$-LOW at a level to achieve a maximum pixel well capacity equal to from 25% to 50% of the full 100% well capacity achieved with voltage $V_G$-HIGH.

9. A system as in claim 7 wherein said means for imposing voltage $V_G$-LOW in setting the level of voltage $V_G$-LOW above the reference signal level for automatic light control used in CCD imager systems, sets the voltage $V_G$-LOW at a level of ¼ to ½ full well saturation.

10. A system as in claim 7 further comprising means for imposing voltage $V_G$-LOW for a time duration greater than about 90% of the total time of charge integration.

11. A system as in claim 7 wherein said pixel signal charge integration well sites contain overflow drains (OD).

12. A system as in claim 7 wherein said overflow drains (OD) comprise vertical overflow drains (VOD).

13. A system for extending the dynamic range of a CCD imager with overflow drains (OD) incorporated into its pixel structures containing pixel signal charge integration wells therein, said pixel structures comprising:

a substrate of one conductivity type;

a region of opposite conductivity type on said substrate, said region being shaped to collect excess signal charge spilling from said pixel signal charge integration wells;

a region of said one conductivity type deposited in the upper surface of said pixel structure containing said pixel signal charge integration wells;

two channel stop regions of strong opposite conductivity type deposited on opposite sides of said region of said one conductivity type; and a gate electrode on a dielectric layer located above said regions on said upper surface of said well portion; and said system further comprising:

means for imposing a voltage $V_G$-LOW on said gate electrode during the incidence of high intensity illumination on said CCD imaging surface, said voltage $V_G$-LOW being of a level that results in signal charge wells above the reference signal level for automatic light control used in CCD imager systems and of a time duration that is a large percentage of the total time of charge integration; and means for imposing a voltage $V_G$-HIGH on said gate electrode during the incidence of high intensity illumination on said CCD imaging surface, said voltage $V_G$-HIGH being of a level that is above the level of said voltage $V_G$-LOW and being imposed for a comparatively short time duration with respect to the total time of charge integration following the imposition of said voltage $V_G$-LOW.

14. A system as in claim 13 further comprising means for setting voltage $V_G$-LOW at a level to achieve a maximum pixel well capacity equal to 25% to 50% of the full 100% well capacity achieved with voltage $V_G$-HIGH.

15. A system as in claim 13 wherein said means for imposing voltage $V_G$-LOW in setting the level of voltage $V_G$-LOW above the reference signal level for automatic light control used in CCD imager systems, sets the voltage $V_G$-LOW at a level of ¼ to ½ full well saturation.

16. A system as in claim 13 further comprising means for imposing voltage $V_G$-LOW for a time duration greater than about 90% of the total time of charge integration.

17. A system as in claim 13 wherein said overflow drain comprises a vertical overflow drain (VOD).

* * * * *